US006452450B1

(12) United States Patent
Enriquez

(10) Patent No.: US 6,452,450 B1
(45) Date of Patent: Sep. 17, 2002

(54) TRANSCONDUCTANCE AMPLIFIER BASED PRECISION HALF WAVE AND FULL WAVE RECTIFIER CIRCUIT

(75) Inventor: Leonel Ernesto Enriquez, Melbourne Beach, FL (US)

(73) Assignee: Intersil Americas Inc, Irvine, CA (US)

( * ) Notice: Subject to any disclaimer, the term of this patent is extended or adjusted under 35 U.S.C. 154(b) by 0 days.

(21) Appl. No.: 09/901,260

(22) Filed: Jul. 9, 2001

Related U.S. Application Data

(63) Continuation-in-part of application No. 09/639,408, filed on Aug. 14, 2000.

(51) Int. Cl.[7] .................................................. H03F 3/45
(52) U.S. Cl. ................................. 330/257; 330/288
(58) Field of Search ............................. 330/257, 258, 330/252; 327/359

(56) References Cited

U.S. PATENT DOCUMENTS

| | | | |
|---|---|---|---|
| 4,091,333 A | 5/1978 | Thrap | 330/100 |
| 4,558,287 A | 12/1985 | Tanaka | 330/257 |
| 5,210,506 A | 5/1993 | Koch et al. | 330/255 |
| 5,357,210 A | 10/1994 | Miljanic et al. | 330/15.1 |
| 5,410,274 A * | 4/1995 | Birdsall et al. | 330/265 |
| 5,521,552 A * | 5/1996 | Butler | 330/257 |
| 5,671,272 A | 9/1997 | Cotreau | 379/382 |
| 5,929,623 A | 7/1999 | Hoshino | 330/257 |
| 6,154,094 A | 11/2000 | Seven | 330/257 |
| 6,259,322 B1 * | 7/2001 | Muza | 330/257 |

FOREIGN PATENT DOCUMENTS

| | | | |
|---|---|---|---|
| JP | 407007337 A | 1/1995 | H03F/3/34 |
| JP | 408018398 A | 1/1996 | H03F/1/34 |

* cited by examiner

Primary Examiner—Robert Pascal
Assistant Examiner—Khanh Van Nguyen
(74) Attorney, Agent, or Firm—Allen, Dyer, Doppelt Milbrath & Gilchrist, P.A.

(57) ABSTRACT

A transconductance amplifier-based, rectifier circuit architecture is configured to programmably provide normal or inverted, half-wave or full-wave rectification of a single ended or differentially derived input signal. The output current produced by commonly connected outputs of current mirror circuits of the transconductance amplifier's output stage from its power supply terminals is coupled through a first pair of opposite polarity rectifier elements to a first pair of rectifier terminals. The current mirrors include additional current mirror outputs coupled to auxiliary current mirror stages, whose outputs are coupled through a second pair of opposite polarity rectifier elements to a second pair of rectifier terminals. Respective ones of the first and second pairs of rectifier terminals are programmably coupled to ground or to a single ended input terminal of an output amplifier stage. Depending on this set of programmable connections, the output amplifier stage provides one of a normal or inverted, half-wave or a full-wave rectified voltage output signal.

15 Claims, 2 Drawing Sheets

US 6,452,450 B1

TRANSCONDUCTANCE AMPLIFIER BASED PRECISION HALF WAVE AND FULL WAVE RECTIFIER CIRCUIT

CROSS REFERENCE TO RELATED APPLICATIONS

The present application is a continuation-in-part of my co-pending U.S. patent application Ser. No. 09/639,408, entitled: "Transconductance Amplifier Circuit," filed Aug. 14, 2000 (hereinafter referred to as the '408 application), assigned to the assignee of the present application, and the disclosure of which is incorporated herein.

FIELD OF THE INVENTION

The present invention relates in general to communication systems and components, and is particularly directed to a new and improved transconductance amplifier-based, rectifier circuit architecture that is preferably of the type described in my above-referenced '408 application, and is configured to programmably provide precision normal or inverted, half-wave or full-wave rectification of a single ended or differentially derived input signal.

BACKGROUND OF THE INVENTION

As described in the above-referenced '408 application, the transmission channels of subscriber line interface circuits, or SLICs, employed by telecommunication service providers include a very demanding set of performance requirements, including accuracy, linearity, insensitivity to common mode signals, low power consumption, low noise, filtering, and ease of impedance matching programmability, to facilitate interfacing the SLIC with a variety of telecommunication circuits including those providing digital codec functionality. In a typical application, the length of the wireline pair to which a SLIC is connected can be expected to vary from installation to installation, may have a significant length (e.g., on the order of multiple miles), and is used to transport both substantial DC voltages, as well as AC signals (e.g., voice and/or ringing). As a consequence, it has been difficult to realize a SLIC implementation that has 'universal' use in both legacy and state of the art installations.

In accordance with the invention disclosed in the above-referenced '408 application, such shortcomings of conventional transconductance amplifier circuits are effectively obviated by a transconductance amplifier circuit, a schematic diagram of a non-limiting bipolar transistor-configured implementation of which is shown in FIG. 1, that is configured to transform a single ended input voltage into a very precise, single ended output current, without requiring a substantial quiescent current, and in a manner which is effectively independent of (differential) voltage supply rails through which the circuit is powered.

In FIG. 1, the transconductance amplifier circuit is shown as including an operational amplifier configured as a unity gain buffer 100. The operational amplifier has a dual polarity input operational amplifier input and gain stage 110, and a low output impedance, single ended output stage 120. The input and gain stage 110, which may have a conventional high impedance, moderate voltage gain circuit configuration, has a first, non-inverting polarity input 111, that is adapted to be coupled to a DC reference voltage, shown as a voltage v0 (relative to ground (GND)), and a second, inverting polarity input 112, which is adapted to track the voltage v0. The input voltage v0 can be selected in compliance with the overhead voltages and power dissipation required by the specific application in which the transconductance amplifier circuit is employed.

The output stage 120 includes a differentially coupled transistor circuit pair, having a first, diode-connected NPN transistor 130, whose collector 131 and base 132 are connected in common to a first polarity output port 113 of the amplifier's input stage 110. The emitter 133 of transistor 130 is coupled in common to the emitter 143 of a second, diode-connected PNP transistor 140. In a complementary fashion, PNP transistor 140 has its collector 141 and base 142 connected in common to a second polarity output port 114 of the amplifier input stage 110. The base 132 of NPN transistor 130 is coupled in common with the base 152 of an NPN transistor 150, the emitter 153 of which is coupled in common to the emitter 163 of a PNP transistor 160 and to an input/output node 123 of output stage 120.

The PNP transistor 160 has its base 162 coupled in common with the base 142 of the PNP transistor 140. The output stage has an input/output node 123 is coupled over a negative feedback path 126 to the inverting input 112 of the input stage 110. Unlike a conventional amplifier circuit, the input/output node 123, rather than being employed to supply an output current to a downstream load, is coupled to receive one or more input currents, respectively supplied through one or more coupling resistors, to associated voltage feed ports. In order to reduce the complexity of the drawing FIG. 1 shows a single coupling resistor Z1 coupled to an input port 125.

The series-connected, collector-emitter current paths through the output transistors 150 and 160 of the transconductance amplifier's output stage 120, rather than being biased via a direct coupling to respective (Vcc and Vee) voltage supply rails 155 and 156, are coupled in circuit with first current supply paths 171 and 181 of first and second current mirror circuits 170 and 180, respectively. As pointed out briefly above, these current mirror circuits serve to isolate the biasing of the amplifier's output stage 120 from its power supply terminals, so that the output current produced at a single ended output port 135 can be accurately controlled independent of the values of the power supply voltages.

The current mirror circuit 170 includes a first PNP transistor 200 having its emitter 203 coupled to the (Vcc) voltage supply rail 155, and its base 202 coupled in common with the base 212 and collector 211 of a diode-connected current mirror PNP transistor 210, whose emitter 213 is coupled to (Vcc) voltage supply rail 155. The current mirror transistor 200 supplies a mirrored output current to the current supply path 172 as a prescribed factor K of the current received by transistor 210 over the current supply path 171, in accordance with the ratio (1:K) of the geometries of the transistors 210/200. The collector 211 and base 212 of transistor 210 are coupled over the first current supply path 171 of the current mirror 170 to the collector 151 of transistor 150 of the output stage 120. The collector 201 of transistor 200 is coupled over a second current supply path 172 of the current mirror 170 to a transconductance stage output node 135.

The current mirror circuit 180 includes a first NPN transistor 220 having its emitter 223 coupled to the (Vee) voltage supply rail 156 and its base 222 coupled in common with the base 232 and collector 231 of a diode-connected current mirror NPN transistor 230, whose emitter 233 is coupled to (Vee) voltage supply rail 156. The collector 231 and base 232 of the current mirror transistor 230 are coupled over the first current supply path 181 of the current mirror 180 to the collector 161 of output stage transistor 160. The collector 221 of transistor 220 is coupled over a second current supply path 182 of the current mirror 180 to the output node 135. The current mirror transistor 220 provides a mirrored output current to current supply path 182 as a factor K of the current received by transistor 230 over current supply path 181, in accordance with the (1:K) ratio of the geometries of transistors 230/220.

An examination of current node equations, set forth below, that define the transfer function of the transconductance amplifier circuit of FIG. 1, reveals that it has a very wide dynamic range and is capable of accommodating single or multiple, differential polarity voltages applied at its one or more voltage feed ports. This wide dynamic range is obtained at a very low quiescent power dissipation.

More particularly, the single ended output current $i_{123}$ delivered to input/output node 123 may be defined in equation (1) as:

$$i_{123}=(v_{125\text{-}1}-v_{111})/R_1 \quad (1)$$

The currents $i_{171}$ and $i_{181}$ supplied to current mirrors 170 and 180 may be related to the current $i_{123}$ at the input/output node 123 by equation (2) as:

$$i_{123}+i_{171}=i_{181}i_{123}=i_{181}-i_{171} \quad (2)$$

The currents $i_{172}$ and $i_{182}$ supplied by current mirrors 170 and 180 may be related to the current $i_{135}$ at the output node 135 by equation (3):

$$i_{172}+i_{135}=i_{182} \quad (3)$$

and equation (4) as:

$$Ki_{171}+i_{135}=Ki_{181}i_{out}=i_{135}=K(i_{181}-i_{171})=Ki_{123} \quad (4)$$

Substituting equation (1) into equation (4) yields equation (5) as:

$$i_{out}=K(v_{125}-v_{111})/R_1 \quad (5)$$

Equations (2) and (4) imply that transistor limitations due to beta and early voltage are compensated or minimized (in a manner not specifically shown in the diagrammatic illustration of FIG. 1). It may also be noted that if transistors 130/150 and 140/160 are matched pairs and the time average value of the input voltage is equal to zero, then the time average values of currents $i_{171}$ and $i_{181}$ are equal to the DC bias current $I_{DC}$ flowing in the emitter path of the output stage transistors 130–140. As a consequence, if the value of the bias current $I_{DC}$ is relatively low and the current mirror ratio K is equal to or less than 1, the quiescent power consumed by the transconductance amplifier circuit can be reduced to a very small value.

As described above, a particularly useful application of the transconductance amplifier circuit of FIG. 1 is a building block for one or more subcircuits, such as but not limited to those employed within a subscriber line interface circuit, or SLIC.

SUMMARY OF THE INVENTION

In accordance with the present invention, the transconductance amplifier circuit of my above-referenced '408 application and shown in FIG. 1 described above, is used to realize a new and improved, precision half-wave or full-wave rectifier for a single ended or differentially source signal. To this end, the very precise output current produced by the commonly connected outputs of the current mirror circuits that isolate the biasing of the transconductance amplifier's output stage from its power supply terminals, is coupled to a first pair of rectifier elements arranged in complementary polarity-coupling directions to a first pair of rectifier terminals.

In addition, each of the current mirror circuits includes an additional current mirror output. These additional current mirror outputs are coupled to respective auxiliary current mirror stages, whose outputs are coupled in common to a second pair of rectifier elements arranged in complementary polarity-coupling directions to a second pair of rectifier terminals. Respective ones of the first and second pairs of rectifier terminals are selectively (programmably) coupled to a prescribed reference voltage (e.g., ground) or to a single ended input terminal of an output amplifier stage. Depending on this set of programmable connections, the output amplifier stage provides one of a normal or inverted, half-wave or a full-wave rectified voltage output signal.

DETAILED DESCRIPTION

Figure 1:
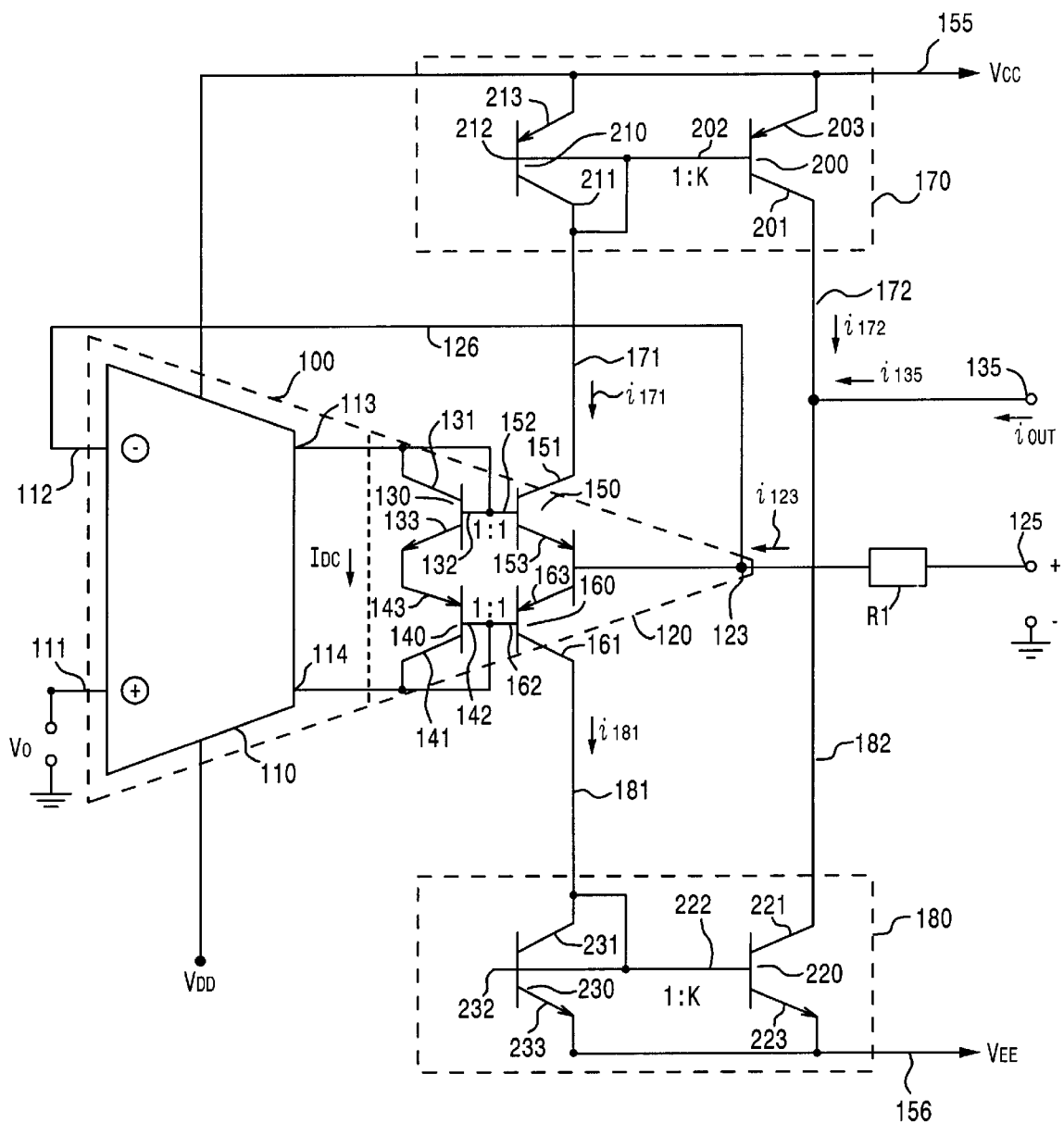
FIG. 1 schematically shows a transconductance amplifier circuit in accordance with the invention disclosed in the above-referenced '408 application.
Figure 2:
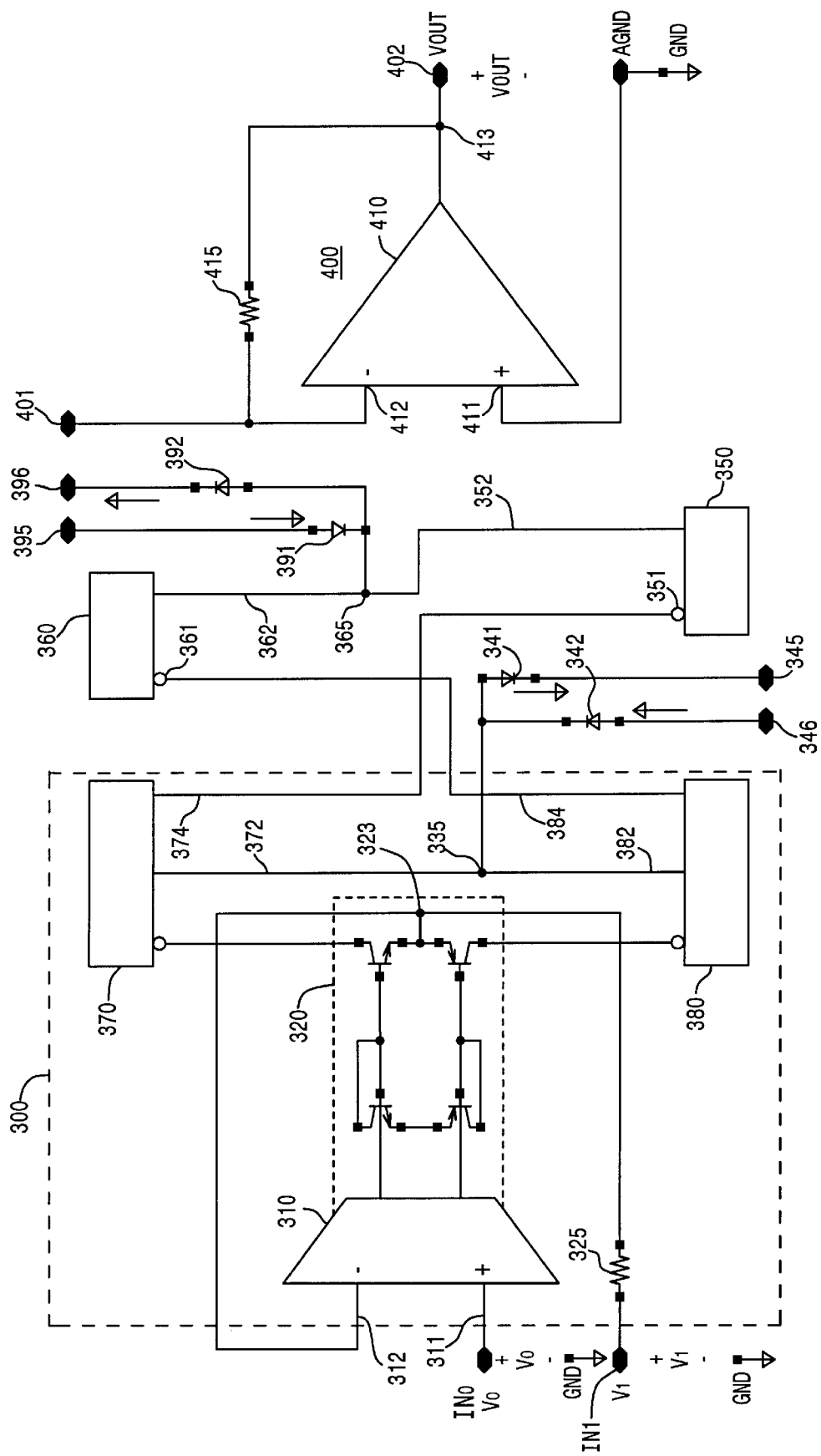
FIG. 2 diagrammatically illustrates a transconductance amplifier-based, rectifier circuit architecture in accordance with the present invention.

The overall architecture of the transconductance amplifier-based, rectifier circuit architecture of the invention is diagrammatically illustrated in FIG. 2 as comprising a front end, transconductance amplifier stage 300, the circuit configuration of which corresponds to that of the transconductance amplifier circuit of FIG. 1. As described above, and as shown in FIG. 2, the front end, transconductance amplifier stage 300 includes a unity gain buffer operational amplifier having a dual polarity input operational amplifier input and gain stage 310, and a low output impedance, single ended output stage 320. The input and gain stage 310 has a first, non-inverting polarity (+) input 311, that is coupled to a first input port $IN_0$ that is adapted to receive a first voltage v0, referenced to a prescribed DC voltage (e.g., ground (GND)), as shown.

The low impedance output stage 320 is configured identically to the output stage 120 in FIG. 1, so that a description thereof will not be repeated here. The low impedance output stage 320 has its input/output node 323 coupled to the second, inverting polarity (−) input 312 of the input gain stage 310, and through an input resistor 325 to a second input port $IN_1$, that is adapted to receive a second voltage v1, referenced to a prescribed DC voltage (e.g., GND), as shown. For differential applications, the (differential) voltage is applied across the input terminals $IN_0$ and $IN_1$; for single ended applications, one of the two input terminals $IN_0$ and $IN_1$ is coupled to a prescribed reference potential (e.g. GND), and the input signal is coupled to the other input terminal.

Also, like the transconductance amplifier of FIG. 1, the transconductance amplifier-based, rectifier circuit architecture of FIG. 2 has its low impedance output stage 320 coupled to a pair of current mirror circuits 370 and 380, which isolate the biasing of the amplifier's output stage from its power supply terminals, and have current supply paths 372 and 382 thereof coupled to a current output node 335 (which corresponds to the single ended output node 135 of FIG. 1).

Pursuant to the invention, the current output node 335 is coupled in common to a first pair of rectifier elements (diodes) 341 and 342, that are coupled in complementary polarity directions to a first pair of rectifier-coupled terminals 345 and 346, respectively. As will be described, depending upon intended rectifier functionality, terminals 345 and 346 are selectively coupled to one of a prescribed reference voltage (GND) or an input terminal 401 of a downstream output amplifier stage 400.

In addition to having its output node 335 coupled to the first pair of rectifier elements 341 and 342, each of the current mirror circuits 370 and 380 further includes an additional current mirror output transistor, from which a respective copy of the mirrored current of the current supply path 372, 382 is supplied. In FIG. 2, these additional mirrored copies of the mirrored currents of the current mirror output paths 372 and 382 are supplied over first and second additional mirror current supply paths 374 and 384, respectively.

The first additional mirror current supply path 374 is coupled to an input 351 of a first auxiliary current mirror stage 350; the second additional mirror current supply path 384 is coupled to an input 361 of a second auxiliary current mirror stage 360. The auxiliary current mirror stages 350 and 360 have respective outputs 352 and 362 thereof coupled in common via node 365 to a second pair of rectifier elements (diodes) 391 and 392, that are coupled in complementary polarity directions to a second pair of rectifier-coupled terminals 395 and 396, respectively. As is the case with rectifier-coupled terminals 345 and 346, depending upon intended rectifier functionality, the terminals 395 and 396 are selectively coupled to one of a prescribed reference voltage (GND) or the input terminal 401 of the output amplifier stage 400.

The output amplifier stage 400 contains an operational amplifier 410 having its non-inverting (+) input 411 coupled to a prescribed reference voltage (here GND) and its inverting (−) input 412 coupled to the input terminal 401. The operational amplifier 410 has its output 413 coupled to an output voltage Vout terminal 402 and through a feedback resistor 415 to inverting (−) input 412.

In operation, let each of the diode-coupled terminals 345, 346 and 395, 396 be initially coupled to ground (or a virtual ground). In this condition, if a current $I_{325\text{-}1}$ through the input resistor 325 from the node 323 into the input terminal $IN_1$ as a result of the relative polarity between input terminals $IN_0$ and $IN_1$, then the following equations (6) and (7) hold:

$$I_{395}=I_{345}=I_{325\text{-}1}, \tag{6}$$

$$I_{396}=I_{346}=0 \tag{7}$$

where $I_{345}$ and $I_{395}$ are phase complementary.

Conversely, when a current $I_{325\text{-}2}$ through the input resistor 325 from the input terminal $IN_1$ into the node 323 as a result of the relative polarity between input terminals $IN_1$ and $IN_0$, then the following equations (8) and (9) hold:

$$I_{395}=I_{345}=0, \tag{8}$$

$$I_{396}=I_{346}=I_{325\text{-}2}, \tag{9}$$

where $I_{346}$ and $I_{396}$ are phase complementary.

From these relationships, it can be seen that, depending upon which of the diode-coupled terminals 345, 346, 395, 396 are selectively disconnected from ground and reconnected to the input terminal 401 of the output amplifier stage 400 (the remaining diode-coupled output terminals being grounded), the voltage Vout at the output terminal 402 can be programmed as one of the following rectified output voltages.

1: Vout=a half-wave rectified voltage signal, where the output amplifier input terminal 401 is coupled to diode-coupled terminal 395.

2: Vout=an inverted half-wave rectified voltage signal, where the output amplifier input terminal 401 is coupled to diode-coupled terminal 345.

3: Vout=a full-wave rectified voltage signal, where the output amplifier input terminal 401 is coupled in common to diode-coupled terminals 346 and 395.

4: Vout=an inverted full-wave rectified voltage signal, where the output amplifier input terminal 401 is coupled in common to diode-coupled terminals 345 and 396.

It should also be noted that crossover distortion in the rectifier architecture of the present invention is limited to that resulting from the time required to turn-on the diodes 341, 342, 391 or 392, and not from the diode voltage itself. Time distortion improvement over conventional rectification schemes can be substantial, especially at low signal frequencies, such as voice frequencies of SLIC applications.

While I have shown and described an several embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A rectifier circuit comprising:

a transconductance amplifier gain stage including an operational amplifier configured as a unity gain buffer and an output stage having an input/output port coupled via a negative feedback path to a first, inverting input of said operational amplifier, a second, non-inverting input of said operational amplifier being coupled to a reference voltage;

first and second current mirror circuits coupled to said output stage of said transconductance amplifier gain stage and having first and second current output ports thereof coupled to a first node, to which a first pair of rectifier elements are coupled in complementary polarity directions to first and second rectifier terminals, and third and fourth current output ports thereof coupled to third and fourth current mirror circuits, said third and fourth current mirror circuits having fifth and sixth current output ports thereof coupled to a second node, to which a second pair of rectifier elements are coupled in complementary polarity directions to third and fourth rectifier terminals; and an output amplifier stage from which a rectified output is derived; and wherein respective ones of said rectifier terminals are selectively coupled to one of said reference voltage and an input of said output amplifier stage.

2. The rectifier circuit according to claim 1, wherein said transconductance amplifier gain stage comprises a differentially coupled transistor circuit pair having a current flow path therethrough coupled to a first current path between said first and second current mirror circuits, and a common node coupled to said input/output port.

3. The rectifier circuit according to claim 1, wherein said input of said output amplifier stage is coupled to one of said first and second rectifier terminals and the other of said first and second rectifier terminals and both of said third and fourth rectifier terminals are coupled to said reference voltage.

4. The rectifier circuit according to claim 1, wherein said input of said output amplifier stage is coupled to one of said third and fourth rectifier terminals and the other of said third and fourth rectifier terminals and both of said first and second rectifier terminals are coupled to said reference voltage.

5. The rectifier circuit according to claim 1, wherein said input of said output amplifier stage is coupled in common to selected pairs of rectifier terminals and others of said rectifier terminals are coupled to said reference voltage.

6. A rectifier circuit comprising:
- an operational amplifier having a first, non-inverting input, and a second, inverting input, and including an output stage coupled in a first current flow path between a first current mirror circuit coupled to a first voltage supply and a second current mirror circuit coupled to a second voltage supply, said output stage having an input/output port coupled by way of a feedback path to said second input of said operational amplifier, said first and second current mirror circuits having first and second current output ports thereof coupled to a first current output node, and third and fourth current output ports;
- third and fourth current mirror circuits respectively coupled to mirror currents at said third and fourth outputs of said first and second current mirror circuits at fifth and sixth current output ports thereof, which are coupled to a second current output node;
- a first pair of rectifier elements coupled in complementary polarity directions between said first current output node and a first pair of rectifier terminals;
- a second pair of rectifier elements coupled in complementary polarity directions between said second current output node and a second pair of rectifier terminals; and
- an output amplifier stage from which a rectified output is derived; and wherein
- respective ones of said first and second pairs of rectifier terminals are selectively coupled to one of said reference voltage and an input of said output amplifier stage.

7. The rectifier circuit according to claim 6, wherein said transconductance amplifier gain stage comprises a differentially coupled transistor circuit pair having a current flow path therethrough coupled to a first current path between said first and second current mirror circuits, and a common node coupled to said input/output port.

8. The rectifier circuit according to claim 6, wherein said input of said output amplifier stage is coupled to one of said first pair of rectifier terminals and the other of said first pair of rectifier terminals and both of said second pair of rectifier terminals are coupled to said reference voltage.

9. The rectifier circuit according to claim 6, wherein said input of said output amplifier stage is coupled to one of said second pair of rectifier terminals and the other of said second pair of rectifier terminals and both of said first pair of rectifier terminals are coupled to said reference voltage.

10. The rectifier circuit according to claim 6, wherein said input of said output amplifier stage is coupled in common to selected ones of said first and second pairs of rectifier terminals and others of said first and second pair of rectifier terminals are coupled to said reference voltage.

11. A method of rectifying a signal comprising the steps of:
(a) providing a rectifier circuit having
- an operational amplifier having a first, non-inverting input, and a second, inverting input, and including an output stage coupled in a first current flow path between a first current mirror circuit coupled to a first voltage supply and a second current mirror circuit coupled to a second voltage supply, said output stage having an input/output port coupled by way of a feedback path to said second input of said operational amplifier, said first and second current mirror circuits having first and second current output ports thereof coupled to a first current output node, and third and fourth current output ports,
- third and fourth current mirror circuits respectively coupled to mirror currents at said third and fourth outputs of said first and second current mirror circuits at fifth and sixth current output ports thereof, which are coupled to a second current output node,
- a first pair of rectifier elements coupled in complementary polarity directions between said first current output node and a first pair of rectifier terminals,
- a second pair of rectifier elements coupled in complementary polarity directions between said second current output node and a second pair of rectifier terminals, and
- an output amplifier stage from which a rectified output is derived;
(b) selectively coupling respective ones of said first and second pairs of rectifier terminals to one of said reference voltage and an input of said output amplifier stage in accordance with a desired mode of rectification of said signal;
(c) applying said signal to be rectified to said operational amplifier; and
(d) deriving a rectified output signal from an output of said output amplifier stage.

12. The method according to claim 11, wherein said transconductance amplifier gain stage comprises a differentially coupled transistor circuit pair having a current flow path therethrough coupled to a first current path between said first and second current mirror circuits, and a common node coupled to said input/output port.

13. The method according to claim 11, wherein step (b) comprises coupling said input of said output amplifier stage to one of said first pair of rectifier terminals, and coupling the other of said first pair of rectifier terminals and both of said second pair of rectifier terminals to said reference voltage.

14. The method according to claim 11, wherein step (b) comprises coupling said input of said output amplifier stage to one of said second pair of rectifier terminals, and coupling the other of said second pair of rectifier terminals and both of said first pair of rectifier terminals to said reference voltage.

15. The method according to claim 11, wherein step (b) comprises coupling said input of said output amplifier stage in common to selected ones of said first and second pairs of rectifier terminals, and coupling others of said first and second pair of rectifier terminals to said reference voltage.

* * * * *